(12) United States Patent
Gooth et al.

(10) Patent No.: US 10,297,739 B1
(45) Date of Patent: May 21, 2019

(54) PARAFERMION BRAIDING DEVICE

(71) Applicant: International Business Machines Corporation, Armonk, NY (US)

(72) Inventors: Johannes Gooth, Horgen (CH); Heinz Schmid, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/914,965

(22) Filed: Mar. 7, 2018

(51) Int. Cl.
| | |
|---|---|
| H01L 39/22 | (2006.01) |
| H01L 39/16 | (2006.01) |
| H01L 39/10 | (2006.01) |
| G06N 99/00 | (2019.01) |
| H01L 39/12 | (2006.01) |
| H03K 19/195 | (2006.01) |
| H03K 19/20 | (2006.01) |
| H01L 27/18 | (2006.01) |

(52) U.S. Cl.
CPC .......... *H01L 39/16* (2013.01); *G06N 99/002* (2013.01); *H01L 27/18* (2013.01); *H01L 39/10* (2013.01); *H01L 39/12* (2013.01); *H01L 39/228* (2013.01); *H03K 19/195* (2013.01); *H03K 19/20* (2013.01)

(58) Field of Classification Search
CPC ....... G06N 99/002; H01L 27/18; H01L 39/00; H01L 39/045; H01L 39/10; H01L 39/12; H01L 39/16; H01L 39/223; H01L 39/226; H01L 39/228; H01L 39/2422; H01L 39/2493; H03K 19/20; H03K 19/195
See application file for complete search history.

(56) References Cited

U.S. PATENT DOCUMENTS

| | | | | |
|---|---|---|---|---|
| 9,517,931 | B2 | 12/2016 | Freedman et al. | |
| 2004/0149983 | A1* | 8/2004 | Lee | H01L 39/225 257/31 |
| 2016/0028403 | A1* | 1/2016 | McCaughan | H01L 39/10 326/7 |
| 2017/0091649 | A1* | 3/2017 | Clarke | G06F 15/82 |

OTHER PUBLICATIONS

Daniel Loss et al., "Majorana and Para-Fermions in Nanowires and Atomic Chains," University of Basel & CEMS RIKEN, 2015, pp. 1-17.
Adrian Hutter et al., "Quantum Computing with Parafermions," Department of Physics, University of Basel, Switzerland, American Physical Society, 2016, pp. 1-7.
Jelena Klinovaja, "Exotic Bound States in Low Dimensions: Majorana Fermions and Parafermions," Department of Physics, University of Basel, Switzerland, University of Basel and Harvard University, 2015, p. 1.

* cited by examiner

*Primary Examiner* — Alexander H Taningco
*Assistant Examiner* — Kurtis R Bahr
(74) *Attorney, Agent, or Firm* — Daniel P. Morris, Esq.; Hoffmann & Baron, LLP

(57) ABSTRACT

A braiding element and a method for operating the braiding device, a structure of braiding devices as well as an array of braiding devices for controlling parafermions for quantum computing may be provided. The braiding device comprises a first wire layer and a second wire layer, a superconductor layer arranged in vertical sandwich-style between the first and the second wire layer such that a device structure is built and a plurality cascades of gate electrodes such that one of the plurality of cascades of gate electrodes is arranged at the first quantum wire layer and at the second quantum wire layer of each of the three legs.

21 Claims, 4 Drawing Sheets

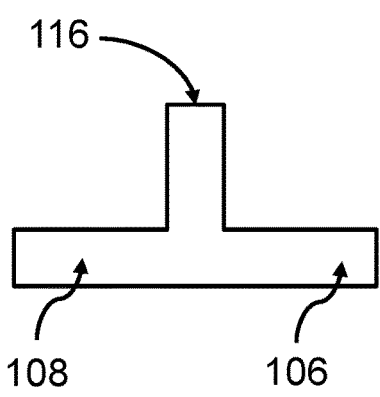
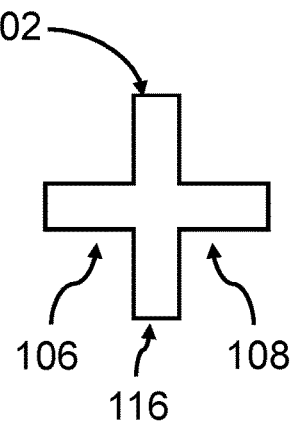
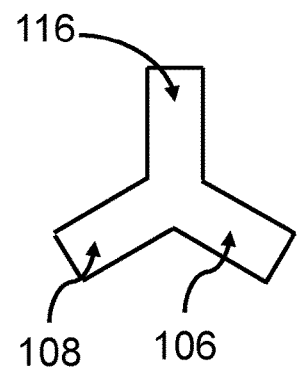
FIG. 2a
FIG. 2b
FIG. 2c
FIG. 3a
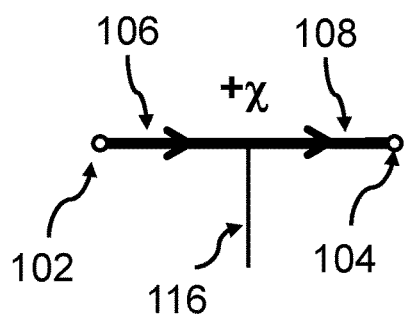
FIG. 3c
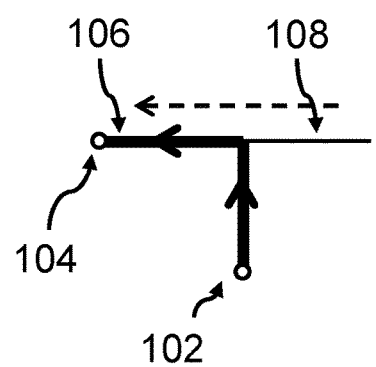
FIG. 3b
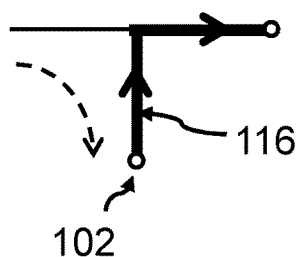
FIG. 3d
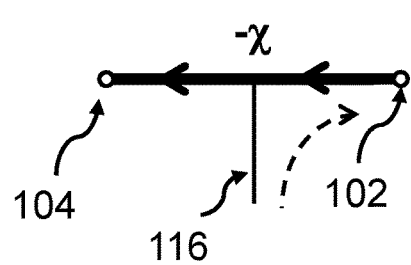

PARAFERMION BRAIDING DEVICE

FIELD OF THE INVENTION

The invention relates generally to a braiding device, and more specifically, to a braiding element for controlling parafermions for quantum computing, as well as a structure of braiding devices and an array of braiding devices. The invention relates further to a related method for operating a braiding element for controlling parafermions for quantum computing.

BACKGROUND

Classical computing using semiconductor devices may reach its physical limits, as suggested by Moore's Law. The industry is currently looking for more and more powerful computers. Therefore, the parallelism of processors and/or threads is pushed forward. However, it is foreseeable that also this approach will reach its natural limitations soon. On the other side, new approaches to computing and data processing based on quantum computing is reaching a stadium in which a higher diversity of devices becomes a requirement.

As known, the model of quantum computation is based on two physical principles: (a) the uncertainty principle, describing that attempting to observe the state in general disturbs it, while obtaining only partial information about the state; (b) and entanglement, describing that two systems scan can exist in an entangled state, causing them to behave in ways that cannot be explained by supposing that each particle has some state of its own.

In classical computing, a storage with n bits may switch from one status (combination of n "1s" and "0s") to another status. Thus, exactly one status may be taken at a time. In contrast to this, a quantum computing system or storage having n quantum bits (qubits) may take $2^n$ statuses at the same time. It is obvious that those quantum computing systems may be much more powerful and suitable to address problems not approachable by traditional computing systems. As a rule of thumb, it is assumed that problems requiring 50 or more qubits may not be solvable by classical computing approaches at all.

Thus, fault tolerant quantum computing over a large scale remains an ongoing challenge. Topological protection systems without local de-coherence is a strong requirement. Braiding of *Majorana* fermions has been one of the most promising approaches. However, in currently available nanowire/superconducting hybrid devices precisely tunable local magnetic fields are required on the nanoscale. Recently, a new anyon, the parafermion, with the same potential for topological quantum computing has been proposed. However, parafermions may eliminate each other if they meet, i.e., collide. Therefore, up to now, no device for braiding of parafermions exists.

There are several disclosures related to quantum computing:

Document U.S. Pat. No. 9,517,931 B2 discloses a measurement-only topological quantum computation using both projective and interferometric measurement of topological charge. Various issues that would arise when realizing it in fractional quantum Hall systems are discussed.

Document titled "Quantum Computing with Parafermions", published in Physical Review B 93, 125105 (2016) by Adrian Hutter and Daniel Loss describes parafermions as exotic non-Abelian quasi-particles generalizing *Majorana* fermions. In contrast to *Majorana* fermions, braiding of parafermions with d>2 may allow to perform an entangling gate.

A disadvantage of known approaches may be that currently no device has been demonstrated to allow a controlled handling of the parafermions. A description of such a device is the objective of the current document.

SUMMARY

According to one aspect of the present invention, a braiding element for controlling parafermions for quantum computing may be provided. The braiding element may comprise a first wire layer, a second wire layer, as well as a superconductor layer arranged in vertical sandwich-style between the first and the second wire layer such that a device structure is built comprising three legs, arranged as two head legs and one foot leg. Furthermore, the braiding element comprises a plurality of cascades of gate electrodes such that one of the pluralities of cascades of gate electrodes is arranged at the first quantum wire layer and at the second quantum wire layer of each of the three legs.

According to another aspect of the present invention, a structure of braiding elements comprising at least two of the braiding elements may be provided, wherein a distal end of a leg of a braiding element is connected to a distal end of a leg of a second braiding element.

According to a further aspect of the present invention, an array of braiding elements, comprising a plurality of braiding elements may be provided, wherein a leg of different braiding devices are connected to another leg of another braiding device.

According to an additional aspect of the present invention, a method for operating a braiding element for controlling parafermions for quantum computing is provided. The braiding element may include a first wire layer, a second wire layer, as well as a superconductor layer arranged in vertical sandwich-style between the first wire layer and the second wire layer building a device structure comprising three legs arranged as two head legs and one foot leg. The method may include generating a pair of parafermions at distal ends of the two head legs by setting the first wire and the second wire layer of each of the two head legs into a superconducting state, wherein the parafermions have a first wave function.

The method may further comprise moving a first parafermion of the pair of parafermions from a first distal end of a first one of the two head legs to a distal end of the foot leg by stepwise disabling the superconducting state of the first wire layer and the second wire layer of the first head leg in a sequential manner from electrode gate area to electrode gate area of a corresponding one of the cascades of electrodes of the first leg, starting at the most distal gate electrode, by applying electrical fields originating from the gate electrodes. It may be noted that the disabling the superconducting state of the first and second nanowire may start at a distal end of the corresponding leg and move stepwise inwards.

It may be noted that in this status the parafermions build another wave function if compared to the original positions of the parafermions.

According to a further aspect, a method for storing different states represented by different wave functions of a pair of braided parafermions being built at distal ends of the head legs of a braiding device by a cyclical clock-wise or counterclockwise exchange of the parafermions of distal ends of the respective head legs may be proposed.

It may be noted that the respective first head leg, the respective second head leg and the respective foot leg have a common connection area in all the above-mentioned braiding elements.

The proposed braiding element for controlling parafermions for quantum computing may offer multiple advantages and technical effects:

Basically, a superconductor structure may be proximity-coupled to two branched (crossed) 1D Rashba nanowire structures. As always with Rashba structures, the nanowire may have different spin-orbit gaps which may be ensured by a symmetric Rashba-coupling of the nanowires or different nanowire diameters. Parafermions may then exist at topological superconducting regions of a related device that occur if the Fermi levels of the nanowires are within their spin-orbit gaps. The braiding operation may then be performed by a cascade of gate electrodes that allow a shifting of the Fermi levels.

Thus, the proposed concept allows for a control braiding of the parafermions using the proposed device structure which may be derived from the proposed braiding element. The device structure itself may take various forms, starting with a three-leg topology that is scalable, but also allowing arrays of the proposed devices enabling—in a controlled way—completely new braiding statuses. In contrast to existing approaches, external magnetic fields are not required for controlling the status of the proposed braiding device. It may allow for tolerant quantum computing with a device topology avoiding local de-coherence because the quantum information is stored "globally;" that is, as a joint wave function of the two parafermions within the one braiding element. The proposed device structure, as well as the related operating method, avoids an elimination of the parafermions because there is no risk that the parafermions meet, i.e., collide with each other.

The proposed braiding element may be the core building block for Controlled NOT gates (CNOT) which is a quantum gate that is an essential component in the construction of a quantum computer. It may be used to entangling and disentangle EPR (Electron Paramagnetic Resonance) states. Any quantum circuit may be simulated to an arbitrary degree of accuracy using a combination of CNOT gates and single qubit rotations. The CNOT gate can be seen as the "quantization" of a classical gate (compare also FIG. 4).

It may also be noted that more complex structures, like longitudinal structures of a plurality of braiding devices by connecting them leg to leg, braiding device meshes and/or arrays of braiding devices, may be built to enable sophisticated and advanced braiding device structures.

In the following, additional embodiments of the inventive concept will be described.

According to one advantageous embodiment, the braiding element may also comprise an electronic control circuitry connected to the each of the gate electrodes for controlling the superconductivity of a portion of the first wire layer and the second wire layer of each of the legs. The electronic control circuitry may thus be enabled to "switch off" the superconducting state in one of the legs in a controlled way. Hence, the parafermions positioned at a distal portion of one of the legs can be moved within the device in a predictable way.

According to one preferred embodiment of the braiding element, the first wire layer and the second wire layer are implemented as different Rashba nanowire structures having different spin orbit gaps. Thus, the prerequisites for parafermions at distal ends of the legs of the device may be met.

According to one additionally, preferred embodiment of the braiding element, the different spin orbit gaps are implemented by an asymmetric Rashba-coupling of the nanowire structures. Again, such an arrangement may be instrumental for "trapping" (i.e., keeping) the parafermions at distal ends of the legs of the device.

According to one alternatively preferred embodiment of the braiding element, the asymmetric Rashba-coupling may be implemented by different diameters—i.e., cross-section areas—of the first wire layer and the second wire layer. This may be another way to fulfill the required prerequisites.

According to one further alternatively preferred embodiment of the braiding element, the asymmetric Rashba-coupling may be implemented by using another material for the first wire layer if compared to the second wire layer. Such implementation may describe a further alternative to meet the necessary requirements.

According to one further advantageous embodiment of the braiding element, a maximum length of the braiding element may have a longitudinal dimension of 100 nm to 10 μm. Typical dimensions may be in the range of 300 nm to 700 nm. A common dimension for the longitudinal dimension of the braiding element may be 500 nm. Such structures may easily be manufactured and interconnected. However, the proposed concept may allow significantly smaller devices.

According to one permissive embodiment of the braiding element, the three legs—i.e., the two head legs and the foot leg—may be arranged in a T-shape form such that the head legs are extending into the same direction and the foot leg is extending vertically to the direction of the head legs. Such a structure may be easy implementable because of the 90° angles between the element leg structures. However, also other directions of the legs may be possible: angles between the three legs of the braiding element may be 120° each. Thus, a completely symmetrical braiding element may be used to build more complex mesh structures. In addition, here, the energy statuses of the parafermions may be comparable at the distal ends of all three legs. It may be understood that in any case the extension of the planes of the first and second nanowire, as well as the superconducting layer, remain the same in all three legs.

According to another permissive embodiment, the braiding element may also comprise a fourth leg comprising the same vertical structure of a first wire layer and a second wire layer, the superconductor layer and the cascade of gate electrodes. The fourth leg may be attached to the device structure such that the fourth leg is arranged vis-à-vis the foot leg of the T-shape structure. Thus, a symmetrical cross of legs may be built. This type of braiding element may build a basis for a more complex and symmetrical array of braiding elements.

According to one preferred embodiment of the braiding element, the material of the first wire layer and/or second wire layer may be selected out of the comprising InAs, GaInAs, InP, GaInP, InSb, GaInSb, GaAs, eventually also Ge and Si. However, also other semiconductor compounds having a high electron mobility may be usable as material for the first wire layer and/or the second wire layer.

According to one additionally preferred embodiment of the braiding element, the superconductor layer comprises at least one out of the group comprising TiN, Al, Nb. However, also other superconducting materials, as well as high-temperature semiconductor material, may be used.

According to a further interesting embodiment, the braiding element may also comprise an electronic read-out circuit adapted for reading out a status of the braiding element using electric and/or optical characteristics of the different states. The electric characteristics may be read-out charge-based, wherein the optical characteristics may be read out using an optical device.

According to one useful embodiment, the braiding element may also comprise an isolating layer between each of the electrodes and the first wire layer and/or the second wire layer. This way, shortcuts may easily be made impossible. The gate electrodes may be controllable individually and in a cascades manner, e.g., by a controller electrically connected to the gate electrodes.

According to one advantageous embodiment, the method may also comprise moving a second parafermion of the pair of parafermions from a first distal end of a second of the two head legs to a distal end of the first head leg by stepwise switching off the superconducting state of the first wire layer and the second wire layer of the second head leg in a sequential manner from electrode area to electrode area of corresponding cascade of electrodes of the second leg, starting at the most distal electrode of the second head leg, such that the pair of parafermions build an intermediate wave function. This intermediate wave function may not represent the final stable state of the parafermions/the braiding element. However, in order to reach stable braiding states of the parafermions, it may be required to move the parafermions in a stepwise approach, clockwise/counter-clockwise, within the braiding element.

According to one equivalently advantageous embodiment, the method may also comprise moving the first parafermion of the pair of parafermions from a distal end of the foot leg to a distal end of the second head leg by stepwise disabling (i.e., switching of) the superconducting state of the first wire layer and the second wire layer of the foot leg in a sequential manner from gate electrode area to gate electrode area of the corresponding cascade of electrodes of the foot leg, starting at the most distal gate electrode of the foot leg, such that the pair of parafermions build a second intermediate wave function. Such an arrangement of the parafermions may represent a different, braided status of the braiding element. The respective wave function $\chi$ may be converted to $-\chi$ which may correspond to "one braid" and thus a different status of the parafermions/braiding element, respectively.

According to one useful embodiment, the method may also comprise re-activating the superconducting status of the first wire layer and the second wire layer of the first head leg before moving the second parafermion. This may be a prerequisite for moving the parafermions in the respective direction, i.e., the respective leg.

According to another useful embodiment, the method may also comprise re-activating the superconducting status of the first wire layer and the second wire layer of the second leg before moving a first parafermion from the foot leg to the second head leg. Such a method step may be useful in order to finalize the movement of the parafermions into the final, in particular braided, state.

BRIEF DESCRIPTION OF THE SEVERAL VIEWS OF THE DRAWINGS

It should be noted that embodiments of the invention are described with reference to different subject-matters. In particular, some embodiments are described with reference to method type claims, whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Figure 1:
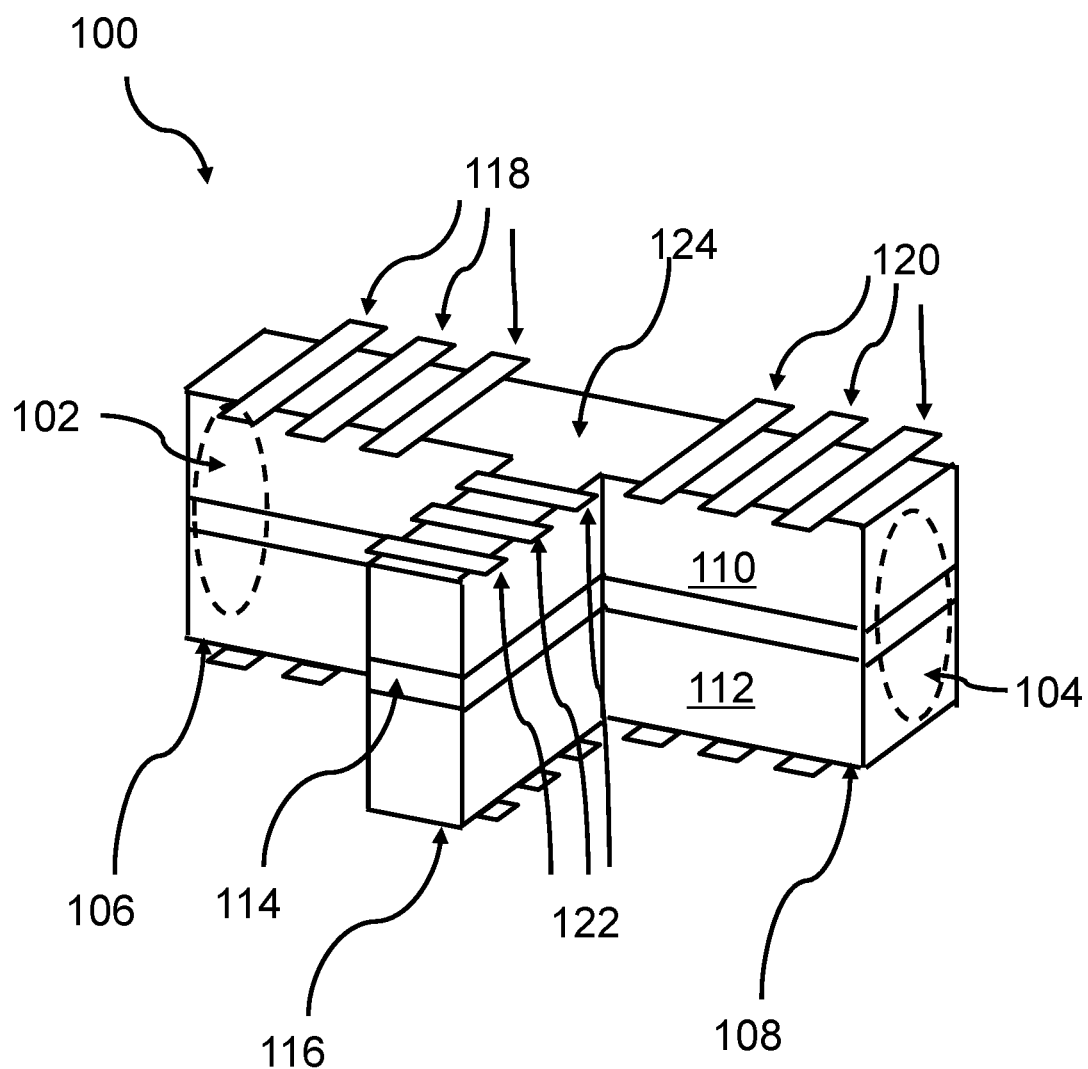

Preferred embodiments of the invention will be described, by way of example only, and with reference to the following drawings:

FIG. 1 shows a block diagram of an embodiment of the inventive braiding element for controlling parafermions for quantum computing.

FIGS. 2a-2c show block diagrams of differently formed embodiments of the braiding element.

FIGS. 3a-3d show block diagrams of a process for a complete braiding to a parafermions in the inventive braiding device.

Figure 4A:
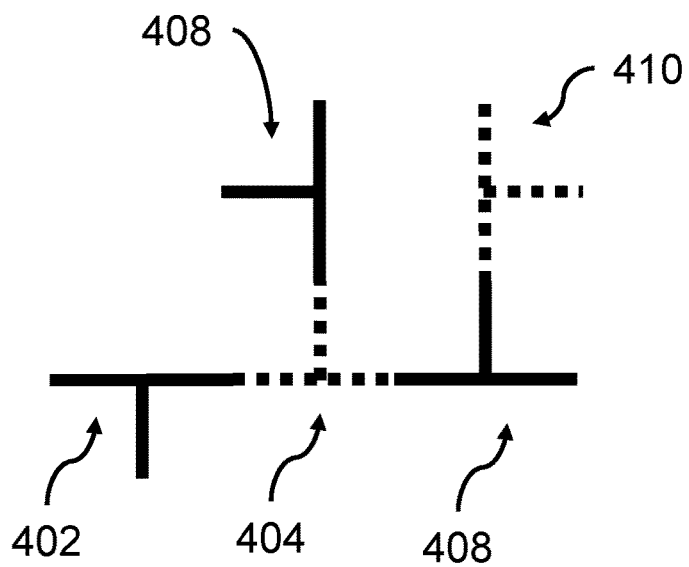
Figure 4B:
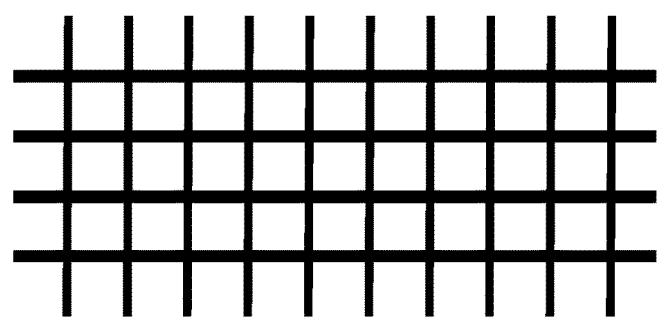
Figure 4C:
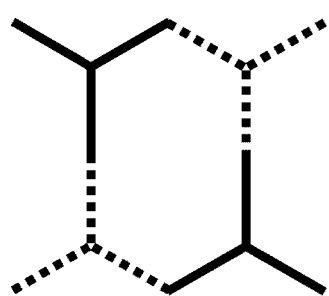

FIGS. 4a-4c show more complex structures built from a plurality of basic braiding devices.

Figure 5:
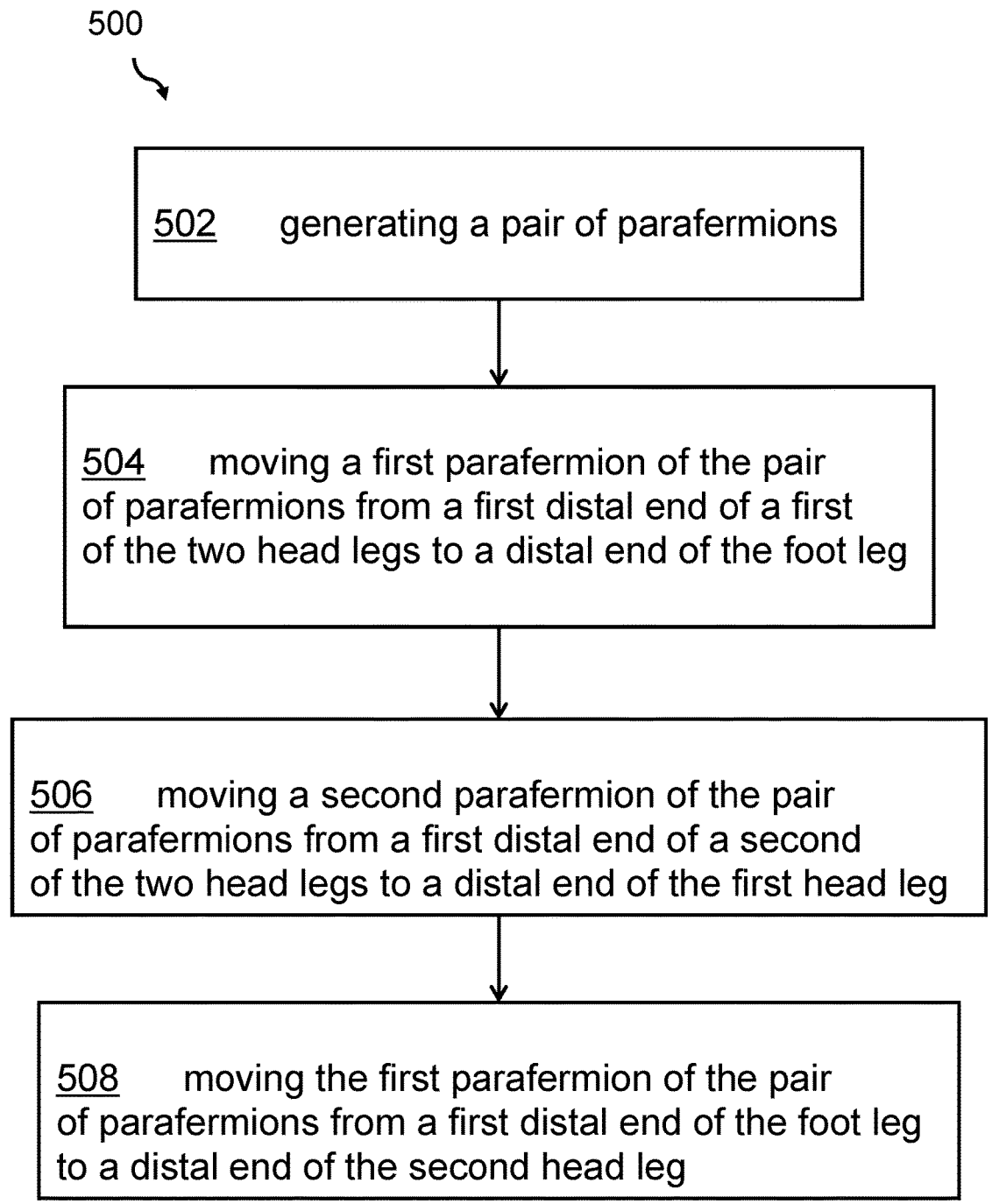

FIG. 5 shows a block diagram of an embodiment of a flowchart of the method for operating the braiding element.

DETAILED DESCRIPTION

In the context of this description, the following conventions, terms and/or expressions may be used:

The term "braiding element" may denote a superconducting device allowing manipulating positions of parafermions in a controlled way. Thereby, each final status of a braid may represent another wave function of the parafermions. This way, a device comprising the braiding element may be able to store as many statuses in the same simple device as braids have been performed to the pair of parafermions. There may be no requirement for magnetic fields in order to make the braiding element/braiding device operational.

The term "braiding" may denote changing a status of a pair of entangled elementary particles, e.g., a pair of parafermions. The pair of parafermions may build a joint wave function which may change once a new braid has been added to the relative positions of the related parafermions.

The term "entanglement"—in particular, quantum entanglement—may denote a physical phenomenon that occurs when pairs or groups of particles are generated or interact in ways such that the quantum state of each particle cannot be described independently of the others, even when the particles are separated by a large distance—instead, a quantum state has to be described for the system as a whole.

The term "topological quantum computer" may denote a computation system that may employ two-dimensional quasi-particles called anyons, whose world lines pass around on another to form braids in a 3-dimensional space (i.e., 1 temporal plus 2 special dimensions). These braids may form the logic gates that make up the computer. The advantage of a quantum computer based on quantum braids over using trapped quantum particles is that the former is much more stable. Small, cumulative perturbations can cause quantum states to de-cohere and introduce errors in the computation, but such small perturbations do not change the braids' topological properties. This is like the effort required to cut a string and reattach the ends to form a different braid, as opposed to a ball (representing an ordinary quantum particle in four-dimensional space-time) bumping into a wall. While the elements of a topological quantum computer originate in a purely mathematical realm, experiments in fractional quantum Hall systems have indicated these elements may be created in the real world using semiconductors made of gallium arsenide at a temperature of near absolute zero and subjected to strong magnetic fields. However, the here proposed device and method may operate in the absence of the strong magnetic fields.

The term "parafermion" may denote a fractional *Majorana* fermion zero-energy bound state. Parafermions represent non-Abelian anyons—i.e., quasiparticles existing in a 2-dimensional space—whose exchanged statistics are non-commutative. These exchange statistics only depend on logical properties of the transitory of a particle but are insensitive to small deformations. Thus, the parafermions may build a basis for performing topological quantum computations.

As known by a skilled person, quasiparticle modes on one- or two-dimensional condensed matter systems can carry (projective) non-Albelian statistics, too, allowing identifying them with non-Albelian anyon models. Most predominantly, the bradding statistics of localized *Majorana* zero modes may be described by the Ising anyon model. Parafermion modes are generalizations of *Majorana* fermions whose braiding behavior is more complex. Parafermions are especially interesting for quantum computing because they allow performing an entangling gate through quasiparticle braiding. In contrast, encodings of a qubit using two or four *Majorana* fermions do not allow performing an entangling gate.

The term "quantum computing" may denote a computation system (quantum computer) that may make direct use of quantum-mechanical phenomena, such as superposition and entanglement, to perform operations on data. Quantum computers are different from binary digital electronic computers based on transistors. Whereas common digital computing requires that the data be encoded into binary digits (bits), each of which is always in one of two definite states (0 or 1), quantum computation uses quantum bits (qubits), which can be in superposition of states. Generally speaking, a set of qubits may be at all possible $2^n$ statuses at the same time. Thus, a quantum computer may test all possible solutions of, e.g., an optimization problem at the same time. A so-called Grover operation (algorithm) may remove or non-usable (non-optimal) results. This may result in an unimaginable increase in available computing power.

The term "wire layer" may denote a thin layer of superconducting material which may be disabled by shifting the fermi level, e.g., applying an electrical field.

The term "superconductor layer" may denote a middle layer in the braiding device which may continue to stay in the superconducting state even if the first and/or second wire layer have disabled superconductivity (e.g., by the electrical field of the gate electrodes).

The term "sandwich-style" may denote that one layer is directly attached to the next layer. The horizontal dimensions and the shape of the layer may be identical. A structure in one layer may be mirrored by the next layer such that the layer fit 1:1 atop each other.

The term "cascade of gate electrodes" may denote a sequence of gate electrodes formed over the first and the second nanowire layer. The cascade may comprise at least two gate electrodes (theoretical only one gate electrode may be sufficient). The position of the gate electrodes above and below a leg of the braiding element in a z-direction (as opposed to the horizontal extension of the legs) should be equivalent, i.e., have a position relative to an end of a leg of equal distances.

The term "electronic control circuitry" may denote a controller adapted for generating signal patterns that may be used to control the superconducting status of areas of the braiding element, in particular, the legs of the braiding device section-wise. Hence, the controller may be coupled electrically to the gate electrodes of the braiding device. It may be adapted to generate bias (voltage) levels at certain gate electrodes, as well as increasing the electrical field relating to one of the gate electrodes such that the superconducting status of an underlying nanowire layer collapses.

The term "Rashba nanowire structures" may denote a conductor structure in which the Rashba effect may be used for a momentum-dependent splitting of spin bands in two-dimensional condensed matter systems (hetero structures and surface states) similar to the splitting of particles and anti-particles in the Dirac Hamiltonian. The splitting is a combined effect of atomic spin-orbit coupling (SOC) and asymmetry of the potential in the direction perpendicular to the two-dimensional plane. Remarkably, this effect can drive a wide variety of novel physical phenomena even when it is a small correction to the band structure of the two-dimensional metallic state.

The term "spin orbit gap" may denote a gap in spin-orbit energy levels. In quantum physics, the spin-orbit interaction (also called spin-orbit effect or spin-orbit coupling, SOC) is an interaction of a particle's spin with its motion. A key example of this phenomenon is the spin-orbit interaction leading to shifts in an electron's atomic energy level, due to electromagnetic interaction between the electron's spin and the magnetic field generated by the electron's orbit around the nucleus. This is detectable as a splitting of spectral lines, which can be thought of as a Zeeman Effect due to the internal field. A similar effect, due to the relationship between angular momentum and the strong nuclear force, occurs for protons and neutrons moving inside the nucleus, leading to a shift in their energy levels in the nucleus shell model. In the field of spintronics, spin-orbit effects for electrons (i.e., fermions) in semiconductors and other materials are currently explored for technological applications. The spin-orbit interaction is one cause of magneto crystalline anisotropy.

The term "asymmetric Rashba-coupling" may denote that the Rashba effect of the coupling of spins of particles is asymmetric.

In the following, a detailed description of the figures will be given. All instructions in the figures are schematic. Firstly, a block diagram of an embodiment of the inventive braiding element for controlling parafermions for quantum computing is given. Afterwards, further embodiments, as well as embodiments of the method for operating a braiding element for controlling parafermions for quantum computing, structure of braiding elements, array of braiding elements, will be described.

FIG. 1 shows a block diagram of an embodiment of the inventive braiding element 100 for controlling parafermions 102, 104 for quantum computing. As can be seen, the parafermions are symbolized by the two dashed ellipses shown at the distal ends of two legs 106, 108 of the braiding element 100.

The braiding element 100 comprises a first wire layer 110 and a second wire layer 112 and a superconductor layer 114 arranged in vertical sandwich-style between the first wire layer 110 and the second wire layer 112 such that a device structure is built comprising three legs 106, 108, 116 arranged as two head legs 106, 108 and one foot leg 116.

A plurality of cascades 118, 120, 122 of gate electrodes is arranged such that one of the pluralities of cascades 118, 120, 122 of gate electrodes is arranged at the first quantum wire layer 110 and at the second quantum wire layer 112 of each of the three legs 106, 108, 116. The expression "arranged at" and the sentence before may denote that the gate electrodes may be arranged over the respective quantum wire layer 110, 112. An isolator may be arranged between the gate electrodes and the respective quantum wire layer in order to prevent shortcuts between the different gates.

It may be noted that only the gates on the top surface of the braiding device 100 have reference numerals. However, from FIG. 1 it should be clear that also on the bottom surface of the braiding device 100 equivalent cascades of gate electrodes (having no explicit reference numerals) are present.

It may also be noted that the three legs are connected to each other in the connection area 124 which may represent the center of the braiding element. Furthermore, a skilled person understands that the parafermions exists—i.e., are generated by the structure of the braiding element itself, in particular, by the sequence of the first nanowire, the superconducting layer and the second nanowire layer.

The thickness of the different layers may typically be 10 nm to 100 nm.

FIGS. 2a-2c show block diagrams of differently formed embodiments of the braiding element. FIG. 2a shows a top view of the braiding element according to FIG. 1. FIG. 2b shows a top view of a braiding element comprising four legs. Beside the legs 106, 108 and 116, a fourth leg 202 of the braiding element is arranged in a way that all four legs form a cross. It may be noted that for various reasons, the length of each of the legs 106, 108, 116, 202 may not be identical. However, for a predictable operation of the braiding element it may be useful that the physical dimensions of the four legs are identical.

FIG. 2c shows again a top view of a braiding element having three legs. However, in this case, the legs are arranged symmetrically. This way, there is no predominant direction of the head legs.

FIGS. 3a-3d show block diagrams of a process for a complete braid of two parafermions in the inventive braiding element. In the initial state, FIG. 3a, the two parafermions 102, 104 are symbolically shown as arrows (spin). Initially, the parafermion 102 sits at the end of a head leg 106, while the second parafermion 104 sits at the second head leg 108. This may represent the wave function x. In a first phase, compare FIG. 3b, the parafermion 102 is moved from leg 106 to leg 116. This is performed by switching off the superconducting state in leg 106 by activating the gates over and below the head leg 102 structure in a cascaded manner. Thus, the parafermion 102 is pushed out of the head leg 106 into the foot leg 116.

In a next phase, FIG. 3c, the parafermion 104 is moved by switching off the superconductivity in the head leg 108. This way, the parafermion of 104 is moved (illustrated by the dashed arrow) into the position of the original position of the parafermion 102 in head leg 106. Then, the superconductivity in head leg 108 is switched on again by disabling the field at the gates of the head leg 108, and enabling a next move of parafermion 102.

In this step, FIG. 3d, the same procedure is repeated: superconductivity is switched off—i.e., disabled—in the foot leg 116, such that the parafermion 102 is moving to the head leg 108. The spin directions of the parafermion 102, 104 are reversed if compared to the original situation in FIG. 3a, and the position of the two parafermion 102, 104 has been exchanged. This may represent a first braiding state with a wave function equivalent to $-\chi$.

FIGS. 4a-4c show more complex structures built from a plurality of basic braiding devices. FIG. 4a shows a linking of different T-shaped braiding elements. Respective legs of the different braiding devices 402, 404, 406, 408, 410 are connected to each other. Each second braiding device 404, 410 is shown in dashed lines in order to make it easier for a visual differentiation. Using those more complex structures, more complex computing devices may be designed moving the parafermions around and across the different braiding devices.

FIG. 4b shows an array of four-leg braiding devices connected to a complex net or mash of braiding devices allowing even more complex statuses management, i.e., computing options.

FIG. 4c shows again another complex structure (top view) using symmetrical three-leg braiding devices. As can be seen, those types of braiding devices allow building hexagons of braiding devices addressing specific classes of computational problems.

FIG. 5 shows a block diagram of an embodiment of a flowchart of the method 500 for operating the braiding element. This may represent a condensed version of the description relating to the FIGS. 3a-3d.

Of course, also here, the braiding element comprises a first wire layer, a second wire layer and a superconductor layer arranged in vertical sandwich-style between the first wire layer and the second wire layer building a device structure comprising three legs arranged as two head legs and one foot leg.

The method 500 comprises generating, 502, a pair of parafermions at distal ends of the two head legs by setting the first wire and the second wire layer of each of the two head legs into a superconducting state—in particular by a near field effect of the superconducting layer. Here, the parafermions are represented by a first wave function.

The method 500 comprises also moving, 504, a first parafermion of the pair of parafermions from a first distal end of a first of the two head legs to a distal end of the foot leg by stepwise switching off the superconductivity state of the first wire layer and the second wire layer of the first head leg in a sequential manner from electrode area to electrode area of corresponding cascades of electrodes of the first leg, starting at the most distal electrode. As before, one of the cascades of gate electrodes is arranged at the first wire layer and at the second wire layer of each of the three legs.

The method 500 comprises as well moving, 506, the second parafermion of the pair of parafermions from a distal end of a second of the two head legs—i.e. its original position—to a distal end of the first head leg. This may again be performed be disabling the superconducting state of the first and second nanowire layer in the second head leg. Thereby, the second parafermion moves to the end of the first head leg.

Finally, the method 500 comprises as well moving, 508, the first parafermion of the pair of parafermions from a distal end of the foot leg to a distal end of the second head leg, i.e., in its new end position. Again, here the gate electrode effect of the electrical field acting on the superconductive state of the first and second nanowire layer—in particular, disabling the superconducting state here—is used. Respective bias voltages may be applied to the gate electrodes in a cascade manner staring from the outer side of the corresponding leg.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, may be implemented by computer readable program instructions, e.g., the applying the bias voltage to the gate electrodes by the controller.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus', and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus', or another device to cause a series of operational steps to be performed on the computer, other programmable apparatus or other device to produce a computer implemented process, such that the instructions which execute on the computer, other programmable apparatus', or another device implement the functions/acts specified in the flowchart and/or block diagram block or blocks.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a," "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A braiding element for controlling parafermions for quantum computing, said braiding element comprising:
   a first wire layer and a second wire layer;
   a superconductor layer arranged in vertical sandwich-style between said first and said second wire layer such that a device structure is built comprising three legs arranged as two head legs and one foot leg, wherein said three legs comprise a joint connection area, and a plurality cascades of gate electrodes such that one of said plurality of cascades of gate electrodes is arranged at said first quantum wire layer and at said second quantum wire layer of each of said three legs,
   wherein the braiding element is configured to allow manipulating positions of parafermions in a controllable way.

2. The braiding element according to claim 1, further comprising an electronic control circuitry connected to said each of said gate electrodes for controlling said superconductivity of a portion of said first wire layer and said second wire layer of each of said legs.

3. The braiding element according to claim 1, wherein said first wire layer and said second wire layer are implemented as different Rashba nanowire structures having different spin orbit gaps.

4. The braiding element according to claim 3, wherein said different spin orbit gaps are implemented by an asymmetric Rashba-coupling of said nanowire structures.

5. The braiding element according to claim 4, wherein said asymmetric Rashba-coupling is implemented by different diameters of said first wire layer and said second wire layer.

6. The braiding element according to claim 4, wherein said asymmetric Rashba-coupling is implemented by using another material for said first wire layer as compared to said second wire layer.

7. The braiding element of claim 1, wherein a maximum length of said braiding element has a longitudinal dimension of about 100 nm to 10 μm.

8. The braiding element according to claim 1, wherein said three legs are arranged in a T-shaped form such that said head legs are extended into said same direction and said foot leg is extending vertically to said direction of said head legs.

9. The braiding element according to claim 8, further comprising:
a fourth leg comprising said same vertical structure of a first wire layer and a second wire layer, said superconductor layer and said cascade of gate electrodes;
wherein said fourth leg is attached to said device structure such that said fourth leg is arranged in relation to said foot leg of said T-shape structure.

10. The braiding element according to claim 1, wherein said material of at least one of said first wire layer and said second wire layer comprises at least one of InAs, GaInAs, InP, GaInP, InSb, GaInSb and GaAs.

11. The braiding element according to claim 1, wherein said superconductor layer comprises at least one of TiN, Al, Nb, and a high-temperature semiconductor material.

12. The braiding element according to claim 1, further comprising an electronic read-out circuit adapted for reading out a status of said braiding element using at least one of electric and optical characteristics of said different states.

13. The braiding element according to claim 1, further comprising an isolating layer between each of said electrodes and at least one of said first wire layer and said second wire layer.

14. A structure of braiding elements comparing at least two braiding elements according to claim 1, wherein a distal end of a leg of a first braiding element is connected to a distal end of a leg of a second braiding element.

15. An array of braiding elements, comprising a plurality of braiding elements according to claim 9, wherein a leg of different braiding devices is connected to another leg of another braiding device.

16. A method for storing different states represented by different wave functions of a pair of braided parafermions being built at distal ends of said head legs of a braiding device according to claim 1, the method comprising exchanging, in a cyclical clockwise or counterclockwise manner, said parafermions at distal ends of said respective head legs.

17. A method for operating a braiding element for controlling parafermions for quantum computing, said braiding element comprising a first wire layer, a second wire layer and a superconductor layer arranged in vertical sandwich-style between said first wire layer and said second wire layer building a device structure comprising three legs arranged as two head legs and one foot leg, wherein said three legs comprise a joint connection area, said method comprising:
keeping a pair of parafermions at distal ends of said two head legs by setting said first wire layer and said second wire layer of each of said two head legs into a superconducting state, wherein said parafermions have a first wave function; and
moving a first parafermion of said pair of parafermions from a distal end of a first of said two head legs to a distal end of said foot leg by stepwise disabling said superconductivity state of said first wire layer and said second wire layer of said first head leg in a sequential manner from gate electrode area to gate electrode area of corresponding cascades of gate electrodes of said first leg, starting at said most distal gate electrode, by applying electrical fields originating from said gate electrodes.

18. The method according to claim 17, further comprising moving a second parafermion of said pair of parafermions from a first distal end of a second of said two head legs to a distal end of said first head leg by stepwise switching off said superconductivity state of said first wire layer and said second wire layer of said second head leg in a sequential manner from electrode area to electrode area of corresponding cascades of electrodes of said second leg, starting at said most distal electrode of said second head leg, such that said pair of parafermions build an intermediate wave function.

19. The method according to claim 18, further comprising moving said first parafermion of said pair of parafermions from a distal end of said foot leg to a distal end of said second head leg by stepwise disabling said superconducting state of said first wire layer and said second wire layer of said foot leg in a sequential manner from gate electrode area to gate electrode area of said corresponding cascade of electrodes of said foot leg, starting at said most distal gate electrode of said foot leg, such that said pair of parafermions build a second intermediate wave function.

20. The method according to claim 18, further comprising re-activating said superconducting status in said first wire layer and said second wire layer of said first head leg before moving said second parafermion.

21. The method according to claim 18, further comprising re-activating said superconducting status of said first wire layer and said second wire layer of said second head leg before moving said first parafermion from said distal end of said foot leg to said distal end of said second head leg.

* * * * *